(12) United States Patent
Pitts et al.

(10) Patent No.: US 7,400,025 B2
(45) Date of Patent: Jul. 15, 2008

(54) INTEGRATED CIRCUIT INDUCTOR WITH INTEGRATED VIAS

(75) Inventors: Robert L. Pitts, Dallas, TX (US); Greg C. Baldwin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/843,952

(22) Filed: May 11, 2004

(65) Prior Publication Data

US 2004/0232556 A1 Nov. 25, 2004

Related U.S. Application Data

(60) Provisional application No. 60/472,265, filed on May 21, 2003.

(51) Int. Cl.
H01L 27/108 (2006.01)
(52) U.S. Cl. .................. 257/531; 257/774; 257/775; 257/E21.022
(58) Field of Classification Search .......... 257/758, 257/762, 765, 774, 828, 531, E21.022, 775; 336/116, 200
See application file for complete search history.

(56) References Cited

U.S. PATENT DOCUMENTS

| | | | | |
|---|---|---|---|---|
| 5,446,311 A * | 8/1995 | Ewen et al. | ................. | 257/531 |
| 5,610,433 A * | 3/1997 | Merrill et al. | ................ | 257/531 |
| 5,612,660 A * | 3/1997 | Takimoto | ..................... | 336/200 |
| 5,656,849 A * | 8/1997 | Burghartz et al. | ........... | 257/528 |
| 5,831,331 A * | 11/1998 | Lee | ............................ | 257/659 |
| 6,037,649 A * | 3/2000 | Liou | .......................... | 257/531 |
| 6,355,535 B2 * | 3/2002 | Liou | .......................... | 438/381 |
| 6,376,895 B2 * | 4/2002 | Farrar et al. | ................. | 257/531 |
| 6,429,504 B1 * | 8/2002 | Beaussart et al. | ........... | 257/531 |
| 6,489,663 B2 * | 12/2002 | Ballantine et al. | ........... | 257/531 |
| 6,559,751 B2 * | 5/2003 | Liu et al. | ..................... | 336/223 |
| 6,566,731 B2 * | 5/2003 | Ahn et al. | .................... | 257/531 |
| 6,717,232 B2 * | 4/2004 | Bothra | ........................ | 257/531 |
| 6,737,727 B2 * | 5/2004 | Gates et al. | .................. | 257/531 |
| 6,833,781 B1 * | 12/2004 | Padmanabhan et al. | ..... | 336/200 |
| 6,879,234 B2 * | 4/2005 | Furumiya et al. | ........... | 336/200 |
| 6,972,081 B2 * | 12/2005 | Wong | .......................... | 205/119 |
| 7,053,460 B2 * | 5/2006 | Volant et al. | ................. | 257/531 |
| 7,082,580 B2 * | 7/2006 | Zarkesh-Ha et al. | ........... | 716/1 |
| 2003/0077871 A1 * | 4/2003 | Cheng et al. | ................. | 438/381 |
| 2004/0070479 A1 * | 4/2004 | Doi et al. | ..................... | 336/200 |

* cited by examiner

*Primary Examiner*—Eugene Lee
(74) *Attorney, Agent, or Firm*—Frederick J. Telecky, Jr.; Wade J. Brady, III

(57) ABSTRACT

Integrated circuit inductors (5) are formed by interconnecting various metal layers (10) in an integrated circuit with continuous vias (200). Using continuous vias (200) improves the Q factor over existing methods for high frequency applications. The contiguous length of the continuous vias should be greater than three percent of the length of the inductor (5).

7 Claims, 4 Drawing Sheets

US 7,400,025 B2

INTEGRATED CIRCUIT INDUCTOR WITH INTEGRATED VIAS

This application claims priority under 35 USC § 119(e)(1) of provisional application Ser. No. 60/472,265, filed May 21, 2003.

FIELD OF THE INVENTION

This invention relates generally to the field of electronic devices and more particularly to an integrated circuit inductor and method for fabricating the same.

BACKGROUND OF THE INVENTION

Integrated circuits comprise electronic devices such as transistors formed in a semiconductor substrate. The interconnection of these electronic devices to form the completed circuit is accomplished by forming metal interconnect lines in dielectric layers above the semiconductor. The metal lines are patterned to produce the required circuit interconnection. In forming the metal interconnects, a dielectric layer is first formed above the semiconductor containing the electronic devices. A first layer of patterned metal interconnect lines is then formed in the dielectric layer. The first layer of patterned metal interconnect lines is connect to the electronic devices by contacts formed in the dielectric layer. The contacts typically comprise columns of metal formed in the dielectric layer. The contacts are typically less than 1 um square. Following the formation of the first layer of patterned metal interconnect lines, additional layers of dielectric layers and patterned metal interconnect lines are formed over the first layer of patterned metal interconnect lines. The additional layers of patterned metal lines are interconnected to each other by vias that are formed in the additional dielectric layers that separate the patterned metal layers. Vias are typically on the order of less than 1 um square.

In addition to the electronic devices formed in the semiconductor additional components such as inductors are often required in integrated circuits that require filters and oscillators. Typical integrated circuit inductors comprise metal windings formed in dielectric layers above the semiconductor. The metal windings of integrated circuit inductors are formed using the same layers of patterned metal interconnect lines. Inductor performance is characterized by a quality (Q) factor with a larger Q factor being more desirable. The Q factor is a function of the operating frequency of the circuit: it increases with increasing frequency in the metal resistance limited regime, then it falls with increasing frequency in the substrate capacitance limited regime. The peak frequency depends on the geometry of the inductor and is chosen near the operating frequency of the circuit. For a given inductor geometry, since the substrate effects are typically fixed by the CMOS requirements, the only way to increase the Q factor is by reducing the metal resistance.

One method of reducing the resistance of the inductor metal lines comprises forming the inductor using multiple layers of metal lines. This method of using multiple lines is effective in obtaining the necessary Q factor for older technologies that used thicker metal lines, since each additional metal line greatly reduced the overall resistance. However with newer technologies, the metal lines are made thinner to reduce the minimum metal pitch, so even stacking all the available metal lines does not provide low enough metal resistance for high Q. Integrated circuits require operating frequencies on the order of tens of gigahertz and the present method of forming integrated circuit inductors is no longer able to achieve the required Q factor of the inductor without the addition of additional metal layers at great cost. For example, with the five metal layers required for integrated circuit operation, a 1.5 nH inductor operating at about 4 GHz requires a quality factor of about 10. Using the five available levels of metal the maximum Q factor obtainable was about 6. Adding an additional level of metal (i.e. a sixth metal level) increased the Q factor to about 13 but required the use of two additional photo-reticles which added great cost to the process. This is therefore a need for an integrated circuit inductor and method for making the same that achieves the required Q factor for a given operating frequency and inductance without the use of additional metal layers and without changing the thickness or process of the existing metal levels. The instant invention addresses this need.

SUMMARY OF THE INVENTION

Accordingly, a need has arisen for an integrated circuit inductor and method for making the same that achieves the required Q factor for a given operating frequency and inductance without the use of additional metal layers and without changing the thickness or process of the existing metal levels. The present invention provides such an inductor that accomplishes this without the use of additional metal layers.

Generally, in one form of the invention, an integrated circuit is formed comprising a plurality of metal layers. At least two of the plurality of metal layers can be interconnected using at least one continuous via between the metal layers to form an integrated circuit inductor of a total length. In an embodiment the continuous via has a contiguous length of greater than three percent of the total length. In a further embodiment the integrated circuit inductor comprises a spiral metal loop. In a further embodiment each of the continuous vias has a contiguous length of greater than ten percent of the total length of the integrated circuit inductor.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIG. 1 through FIG. 4(d) illustrates various aspects of an inductor and a method of fabricating said inductor. As described in greater detail below, the instant invention can be used to form an integrated circuit inductor with an improved Q factor.

Figure 1:
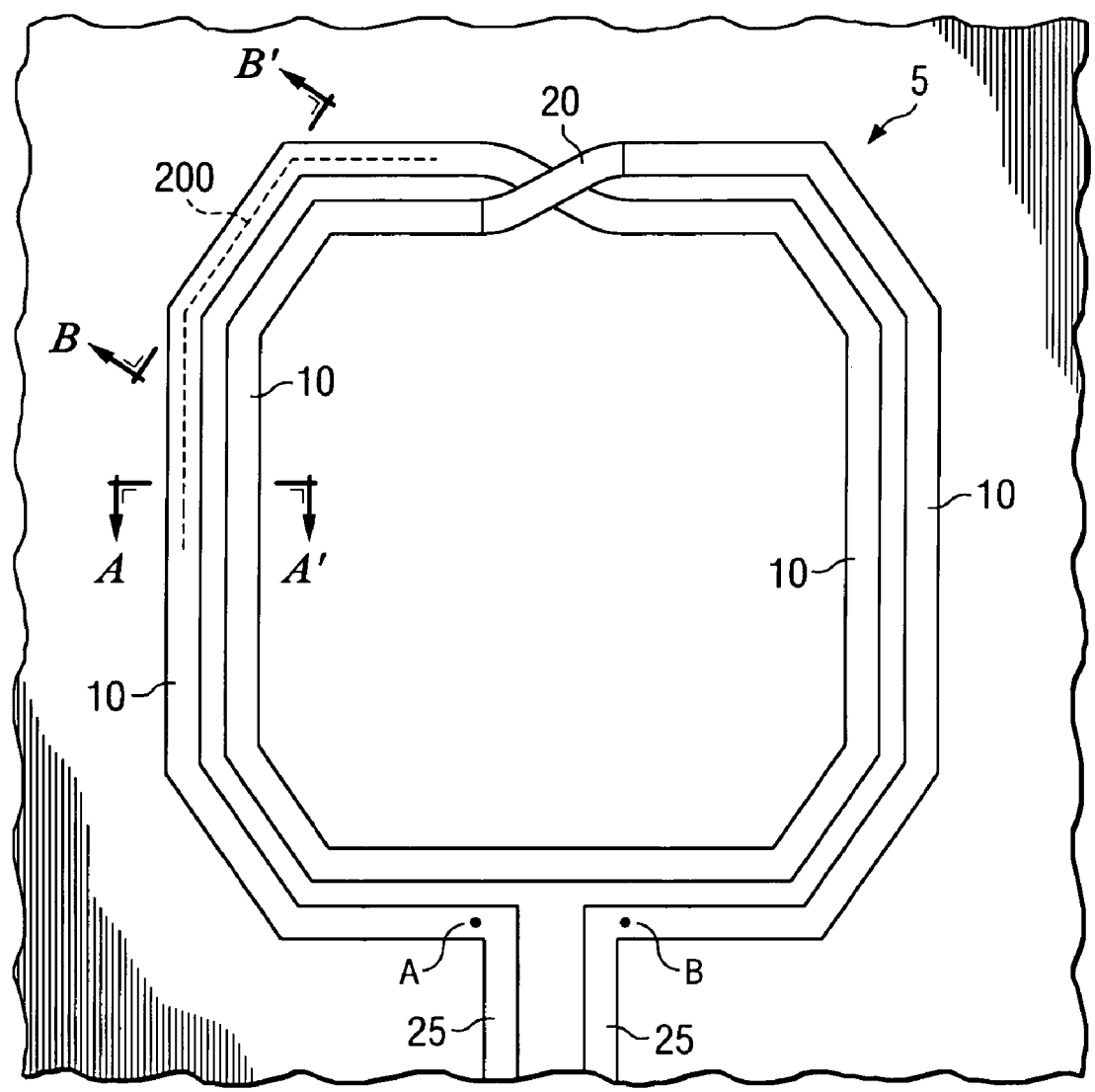
FIG. 1 is a drawing showing a symmetric integrated circuit inductor according to an embodiment of the instant invention.

Shown in FIG. 1 is a symmetric inductor 5 according to an embodiment of the instant invention. The inductor 5 comprises a spiral metal loop 10 formed by connecting various levels of metal in the integrated circuit. The inductor further comprises a cross-over metal portion 20 that completes the spiral. The inductor is interconnected to other portions of the integrated circuit through the leads 25. The invention is not to be limited to the particular shape of the inductor shown in FIG. 1. Non-symmetric inductors can be formed with varying shapes within the scope of the instant invention.

Figure 2:
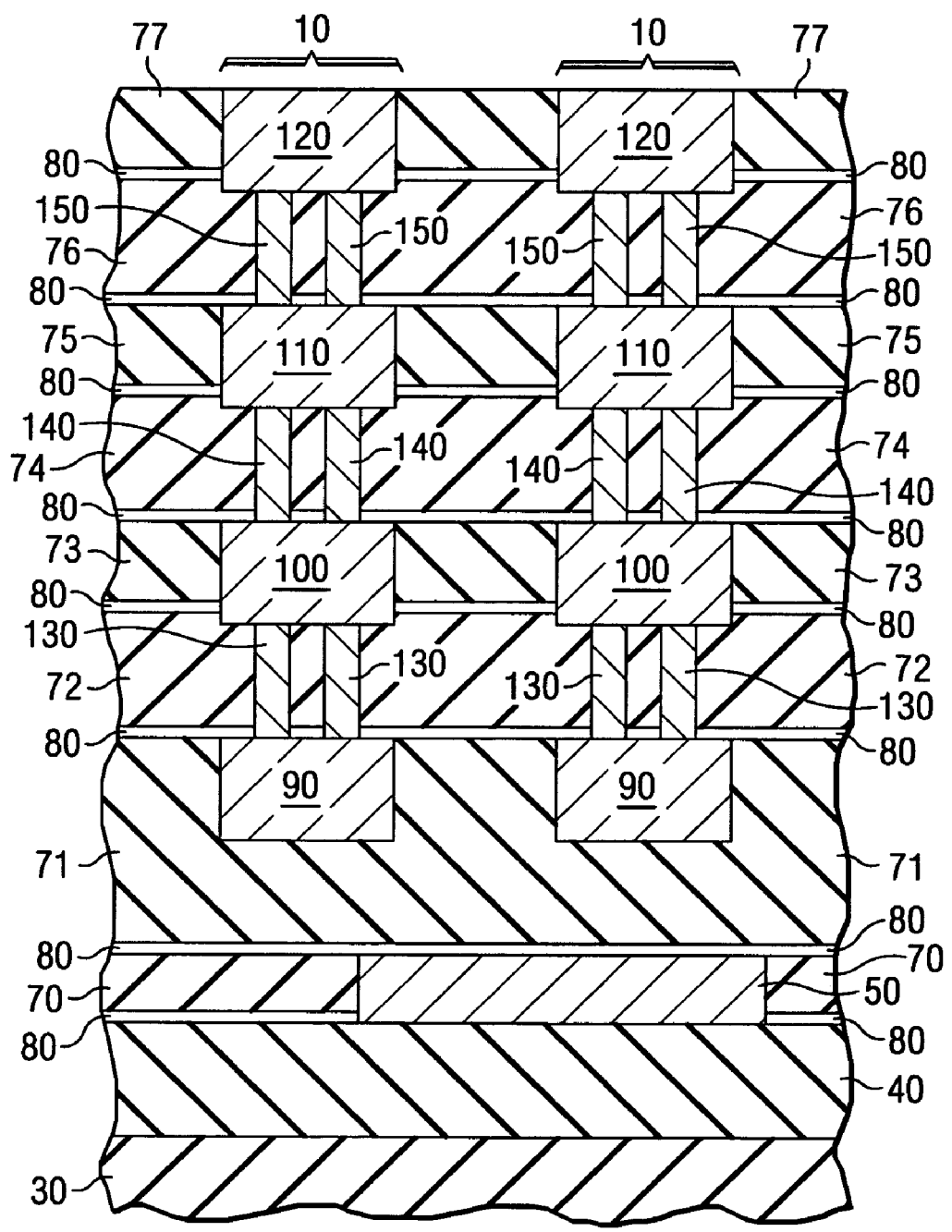
FIG. 2 is a cross-sectional diagram taken through the plane AA' of FIG. 1 showing the continuous vias used to interconnect the various levels of metals.

Shown in FIG. 2 is a cross-section diagram taken through the plane AA' in FIG. 1. Electronic devices such as transistors are formed in a semiconductor 30. The various electronic devices formed in the semiconductor 30 are omitted from the Figure for clarity. The electronic devices formed in the semiconductor 30 will be interconnected with various levels of metal to form the integrated circuit. Typically three to five different levels of metal will be used to form the integrated circuit. In forming the inductor according to the instant invention some or all of the various metal levels used to interconnect the integrated circuit will be used to form the inductor. Shown in FIG. 2 is an embodiment where four of the five existing metal levels are used to form the inductor. As shown in FIG. 2, a first dielectric layer 40 is formed over the semiconductor 30. The first dielectric layer 40 can comprise phosphosilicate glass (PSG) or other suitable dielectric material. Shown throughout all the dielectric layers formed in the integrated circuit are barrier layers 80 that are sometimes used in forming the various metal layers. The use of the barrier layers 80 is optional and the barrier layers 80 will not be present in other embodiments. In the embodiments that contain a barrier layer 80, the barrier layer can comprise silicon nitride or other suitable dielectric material.

Following the formation of the first dielectric layer 40, a second dielectric layer 70 is formed. The second dielectric layer can comprise organosilicate glass (OSG) or other suitable dielectric material. A first metal layer 50 is formed in the second dielectric layer 70. In embodiments of the instant invention the first metal layer 50 comprises copper, aluminum, or suitable metals. Metal layers 90, 100, 110, and 120 comprise the second, third, fourth, and fifth levels of metal respectively and are interconnected with the continuous vias 130, 140, and 150 to form the inductor 10. In forming the inductor using the second, third, fourth, and fifth metal levels, a dielectric layer 71 is formed over the first metal layer 50 and the second metal layers 90 are formed in the dielectric layer 71. Dielectric layers 72 and 73 are formed over the second metal layer 90 with the third metal layers 100 being formed in dielectric layer 73. The continuous vias 130 connecting the second metal layers 90 and the third metal layers 100 are formed in dielectric layer 72. In a similar manner dielectric layers 74 and 75 are formed over the third metal layers 100 with the fourth metal layers 110 being formed in dielectric layer 75. The continuous vias 140 connecting the third metal layers 100 and the fourth metal layers 110 are formed in dielectric layer 74. Finally dielectric layers 76 and 77 are formed over the fourth metal layers 110 with the fifth metal layers 120 being formed in dielectric layer 77. The continuous vias 150 connecting the fourth metal layers 110 and the fifth metal layers 120 are formed in dielectric layer 77. In an embodiment of the instant invention the dielectric layers 72, 73, 74, and 75 can comprise OSG or other suitable dielectric material. In a further embodiment dielectric layers 76 and 77 can comprise florosilicate glass (FSG) or other suitable dielectric material. Metal layers 90, 100, 110, 120 and the connecting vias 130, 140, and 150 can comprise copper, aluminum, or other suitable metals. FIG. 2 illustrates that each metal line 10 of the spiral inductor 10 shown in FIG. 1 is comprised of four metal lines (i.e. metal layers 90, 100, 110, and 120) interconnected by the continuous vias 130, 140, and 150.

Different regions of the metal layers 90, 100, 110, and 120 used to form the inductor will simultaneously be used to form the metal interconnect lines of the integrated circuit. As described previously square or non-continuous vias are used to interconnect the various metal interconnect lines in the integrated circuit. Inductors formed using the square vias will not achieve the required Q factor values required for gigahertz operation. Therefore according to the embodiment of the instant invention illustrated in FIG. 2 continuous vias 130, 140, and 150 are used to form the inductor 5. For this invention a continuous via is defined, in a first embodiment, as a via whose contiguous or unbroken length is at least 3% of the total length of the metal used to form the inductor. For the inductor shown in FIG. 1 the total length is defined as the distance along the metal 10 from point A to point B. An example of a continuous via according to the instant invention is shown by the dashed line 200 in FIG. 1. The contiguous or unbroken length of the continuous via 200 is clearly greater than 3% of the total length of the inductor. The continuous vias of the instant invention can also be described as slots that connect the various layers of metals. In a first embodiment of the instant invention the length of each slot is greater than 5% of the total length of the inductor. Further embodiments can have continuous vias or slots whose contiguous or unbroken lengths are greater than 5%, 10%, 15%, 20%, 50%, 75%, or 90% of the total length of the inductor. In addition any number of slots can be used to interconnect the various levels of metal. In the embodiment shown in FIG. 2 two continuous vias or slots are used to interconnect each metal line 90, 100, 110, and 120. In other embodiments a single continuous via or slot as well as multiple numbers of continuous vias and slots such as three, four, five, six, seven, eight, etc can also be used. Finally any number of metal levels can be interconnected to form the inductor. Therefore, in addition to the four levels of metal shown in FIG. 2, other embodiments can comprise interconnecting two, three, five, six, seven, and eight levels of metal to form the inductor.

Figure 3:
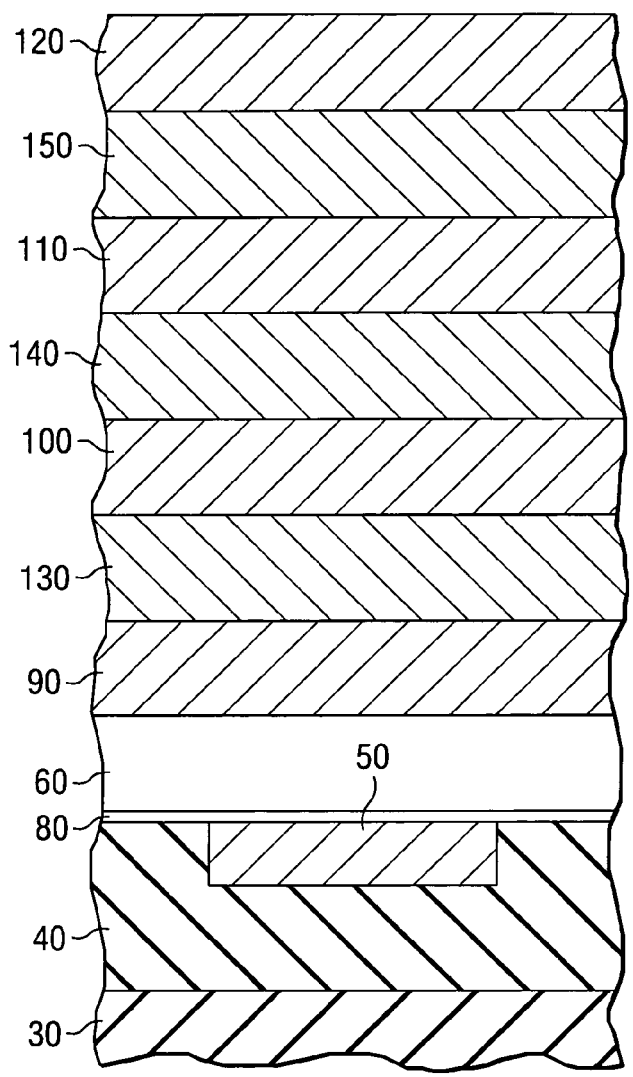
FIG. 3 is a cross-sectional diagram taken through the plane BB' of FIG. 1 showing the continuous vias used to interconnect the various levels of metals.

Shown in FIG. 3 is a cross-section diagram taken through the plane BB' in FIG. 1. The continuous vias 130, 140, and 150 are shown between the various metal levels 90, 100, 110, and 120 connecting the various metal layers. The semiconductor 30, the first dielectric layer 40, the first metal layer 50, a patterned photoresist layer 60, and a barrier layer 80 are also shown in FIG. 3.

Figure 4A:
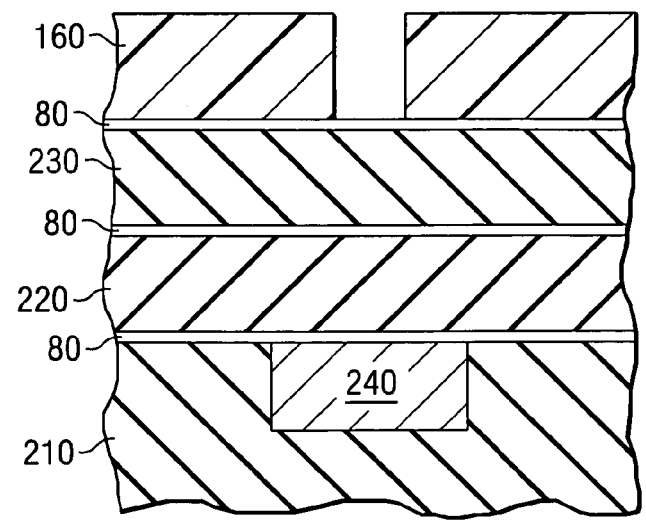
FIGS. 4A-4C are cross-sections illustrating a method of forming the inductor in accordance with an embodiment of the instant invention.
Figure 4B:
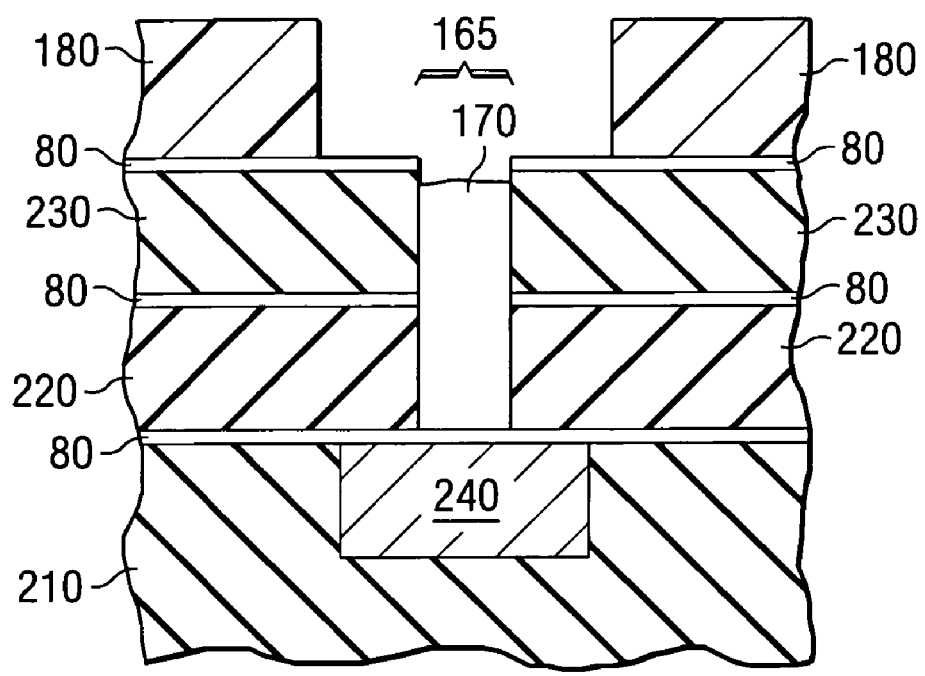
Figure 4C:
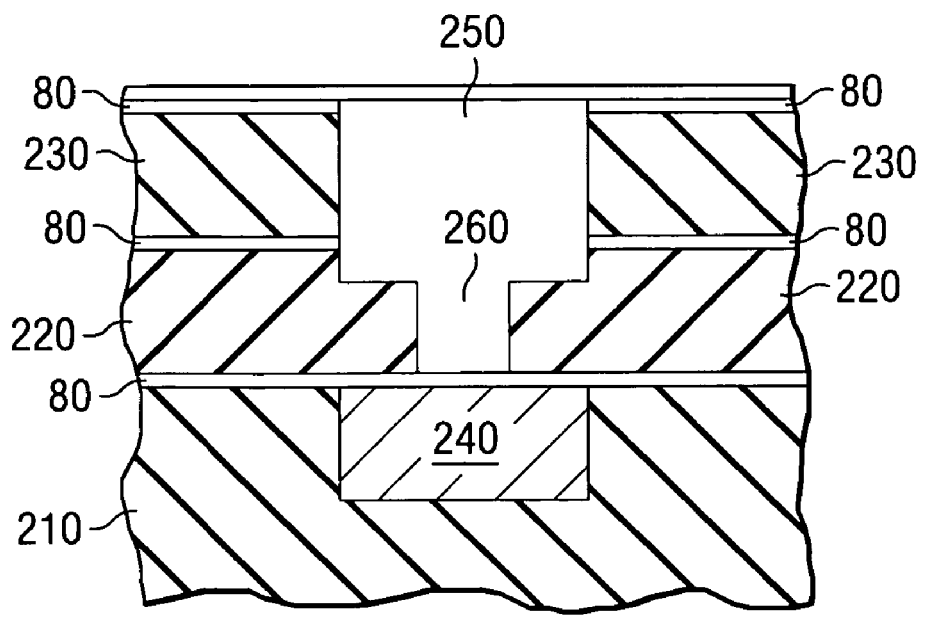

Shown in FIG. 4(a) to FIG. 4(c) are cross-sectional diagrams illustrating a method for forming a contiguous via or slot and a metal line. As shown in FIG. 4(a) a metal layer 240 is formed in a first dielectric layer 210. A barrier layer 80 is formed over the metal layer 240 and the first dielectric layer 210. A second dielectric layer 220 is formed over the barrier layer and a barrier layer 80 is formed over the second dielectric layer 220. A third dielectric layer 230 is formed over the barrier layer 80 and a barrier layer is formed over the third dielectric layer 230. It should be noted that the use of the barrier layers is optional. Following the formation of a barrier layer over the third dielectric layer 230, a patterned photoresist layer 160 is formed over the barrier layer. The patterned photoresist layer will be used as an etch mask during the etching of the dielectric layers.

As shown in FIG. 4(b) a second patterned photoresist layer 180 is formed above the barrier layer following the etching of the slot 165 through the dielectric layer 220 and 230 and various barrier layers 80. Prior to the formation of the patterned photoresist layer 180 the slot 165 is partially filed with the material used to form a BARC layer beneath the patterned photoresist layer. This partial filling of the slot 165 with BARC material is an optional step. Following the formation of the patterned photoresist layer 180 an opening is formed in the third dielectric layer 230 using the patterned photoresist 180 as an etch mask. The second dielectric layer 220 may also be partially etched by the etching process. Following the removal of all remaining photoresist and BARC material metal such as copper is formed in the remaining slot 165 and the opening formed in the third dielectric layer 230. The formation of metal results in a second metal layer 250 connected to the first metal layer by the continuous via or slot 260. The copper can be formed by first forming copper in the opening and remaining slot and removing the excess copper from the structure using chemical mechanical polishing. In a similar manner other layers of metal and interconnecting continuous vias or slots can be formed to complete the formation of the inductor.

Although the present invention has been described with several embodiments, various changes and modifications may be suggested to one skilled in the art. It is intended that the present invention encompass such changes and modifications that follow within the scope of the appended claims.

We claim:

1. An integrated circuit inductor having reduced metal resistance at a peak operating frequency for a given inductor geometry, comprising:

an integrated circuit comprising a plurality of metal layers, each metal layer defined by substantially planar surfaces; and at least one continuous elongated slot-shaped via positioned perpendicularly between and interconnecting adjacent metal layers, each via having an unbroken length coextensive with a predetermined length of the substantially planar surfaces, and each slot shaped via structurally distinct from adjacent metal layers to form an integrated circuit inductor of a total length wherein the unbroken length of each of said continuous vias is greater than three percent of said total length of said integrated circuit inductor.

2. The integrated circuit inductor of claim 1 wherein said integrated circuit inductor comprises a spiral metal loop.

3. The integrated circuit inductor of claim 2 wherein said integrated circuit inductor and said continuous vias are formed from a metal selected from the group consisting of copper and aluminum.

4. The integrated circuit of claim 1 wherein each of said continuous vias has an unbroken length of greater than ten percent of said total length of said integrated circuit inductor.

5. The integrated circuit of claim 4 wherein each of said continuous vias has an unbroken length of greater than twenty percent of said total length of said integrated circuit inductor.

6. The integrated circuit of claim 1, wherein at least two of the plurality of continuous vias are used between adjacent metal layers.

7. The integrated circuit of claim 1, wherein said continuous vias are non-square.

* * * * *